United States Patent [19]
Jin et al.

[11] Patent Number: 5,883,001
[45] Date of Patent: *Mar. 16, 1999

[54] INTEGRATED CIRCUIT PASSIVATION PROCESS AND STRUCTURE

[75] Inventors: Been Yih Jin, Hsin Chu; Daniel L. W. Yen, Taipei; Wen Yen Hwang, Hsin Chu; Ming Hong Wang, Touliu; Sheng Hsien Wong, Taipei; Gino Hwang, Hsin Chu; Po Shen Chang, Nantou; Yu Tsai Liu, Hsin Chu; Chung Chi Chang, ChuTung; Ta Hung Yang, Tai Chung, all of Taiwan

[73] Assignee: Macronix International Co., Ltd., Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 481,470
[22] PCT Filed: Nov. 7, 1994
[86] PCT No.: PCT/US94/12780
  § 371 Date: Jul. 13, 1995
  § 102(e) Date: Jul. 13, 1995
[87] PCT Pub. No.: WO96/14657
  PCT Pub. Date: May 17, 1996
[51] Int. Cl.$^6$ .................................................. H01L 21/268
[52] U.S. Cl. .......................... 438/624; 438/622; 438/624; 438/760; 438/782; 438/784; 438/958
[58] Field of Search .................................... 437/228, 231, 437/235; 438/782, 958, 760, 622, 624, 628, 626, 783, 784

[56] References Cited

U.S. PATENT DOCUMENTS

| Re. 32,351 | 2/1987 | Dawson et al. ............................. 29/571 |
| 4,097,889 | 6/1978 | Kern et al. .................................. 357/54 |
| 4,372,034 | 2/1983 | Bohr ......................................... 29/577 |

(List continued on next page.)

OTHER PUBLICATIONS

Stanley Wolf, Silicon Processing, vol. 1, pp. 188, 189, 1990.

van den Hoek, W. G. M. et al., "Isotropic plasma etching of doped and undoped silicon dioxide for contact holes and vias", *Journal of Vacuum Science & Technology*, A 7 (3), May/Jun. 1989, pp. 670–675.

*Primary Examiner*—Charles Bowers
*Assistant Examiner*—Thanh Nguyen
*Attorney, Agent, or Firm*—Mark A. Haynes; Wilson, Sonsini, Goodrich & Rosati

[57] ABSTRACT

A method for forming a UV transmission passivation coating on an integrated circuit, such as EPROM, after completion of the active device and metal routing circuitry comprises depositing a first barrier dielectric layer over the integrated circuit; smoothing out underlying features by applying a layer of flowable dielectric over the first dielectric layer; and depositing a second dielectric layer over the flowable dielectric. Next a photoresist pattern is made over the second dielectric coating, having an opening layer over the at least one conductive pad. A wet etch process is used to remove portions of the second dielectric layer exposed by the opening. A dry etch process is used to remove portions of the remaining layers exposed through the opening, including the remaining portions of the second dielectric layer, the flowable dielectric layer and the first dielectric layer, down to the conductive pad. Finally, the photoresist is removed. The second dielectric layer is composed of a first protective dielectric, such as silicon oxynitride, deposited using plasma enhanced chemical vapor deposition, to protect the flowable dielectric layer from the subsequent wet etch process. The second dielectric layer also includes a top layer deposited using plasma enhanced chemical vapor deposition and comprising phosphorus doped silica to provide a stress buffer, and to prevent penetration of mobile ions to the first dielectric layer. The phosphorus doped silica layer is deposited using both high frequency and low frequency power for plasma formation during the deposition to increase the quality of the layer.

21 Claims, 5 Drawing Sheets

U.S. PATENT DOCUMENTS

| | | | |
|---|---|---|---|
| 4,581,622 | 4/1986 | Takasaki et al. | 357/23.5 |
| 4,618,541 | 10/1986 | Forouhi et al. | 428/688 |
| 4,665,426 | 5/1987 | Allen et al. | 357/54 |
| 4,676,869 | 6/1987 | Lee et al. | 156/643 |
| 4,775,550 | 10/1988 | Chu et al. | 437/38 |
| 4,816,115 | 3/1989 | Horner et al. | 156/643 |
| 4,885,262 | 12/1989 | Ting et al. | 437/231 |
| 4,962,063 | 10/1990 | Maydan et al. | 437/22 |
| 4,986,878 | 1/1991 | Malazgirt et al. | 156/643 |
| 5,003,062 | 3/1991 | Yen | 437/231 |
| 5,010,024 | 4/1991 | Allen et al. | 437/24 |
| 5,094,900 | 3/1992 | Langley | 428/131 |
| 5,252,515 | 10/1993 | Tsai et al. | 437/195 |
| 5,254,497 | 10/1993 | Liu | 438/624 |
| 5,260,236 | 11/1993 | Petro et al. | 437/241 |
| 5,306,936 | 4/1994 | Goto | 257/324 |
| 5,306,946 | 4/1994 | Yamamoto | 257/640 |
| 5,362,686 | 11/1994 | Harada | 437/238 |
| 5,376,590 | 12/1994 | Machida et al. | 437/235 |
| 5,399,533 | 3/1995 | Pramanik et al. | 438/624 |
| 5,470,793 | 11/1995 | Kalnitsky | 437/195 |
| 5,557,565 | 9/1996 | Kaya et al. | 365/185.01 |

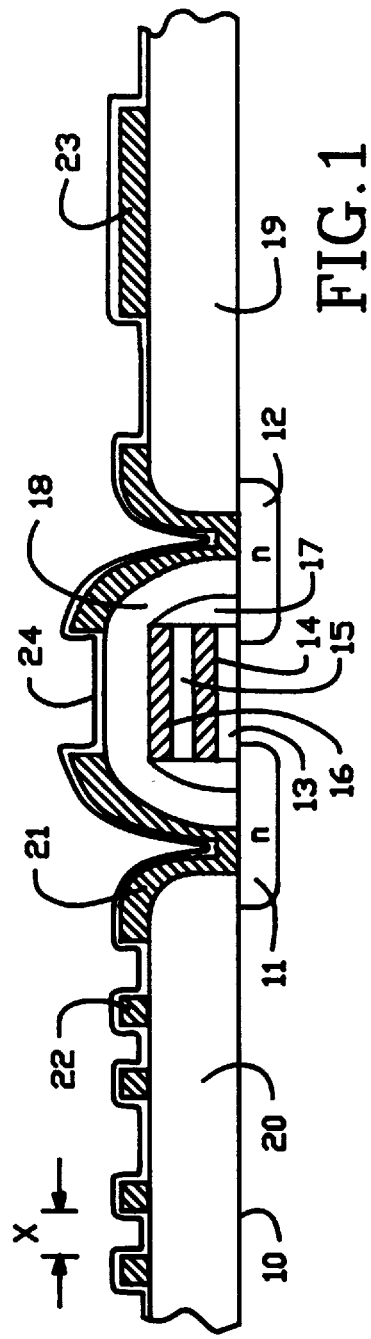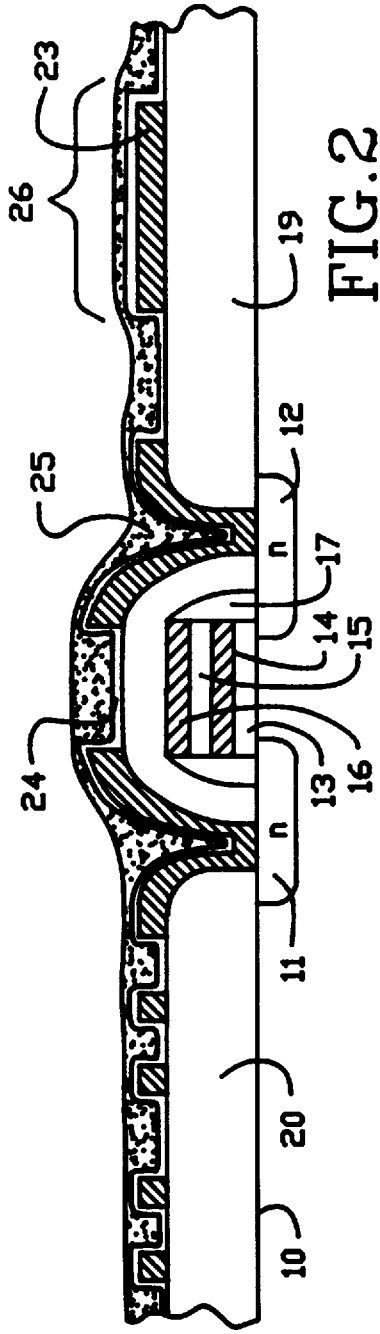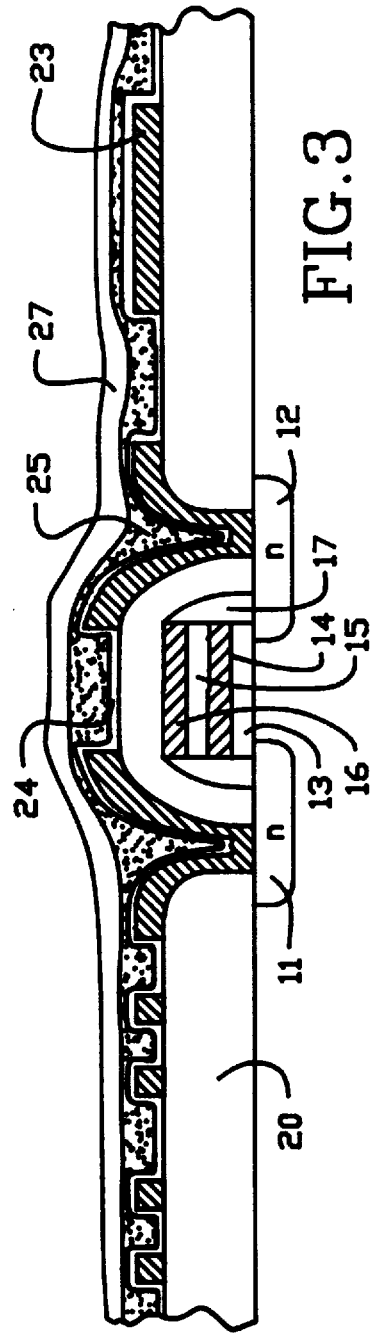

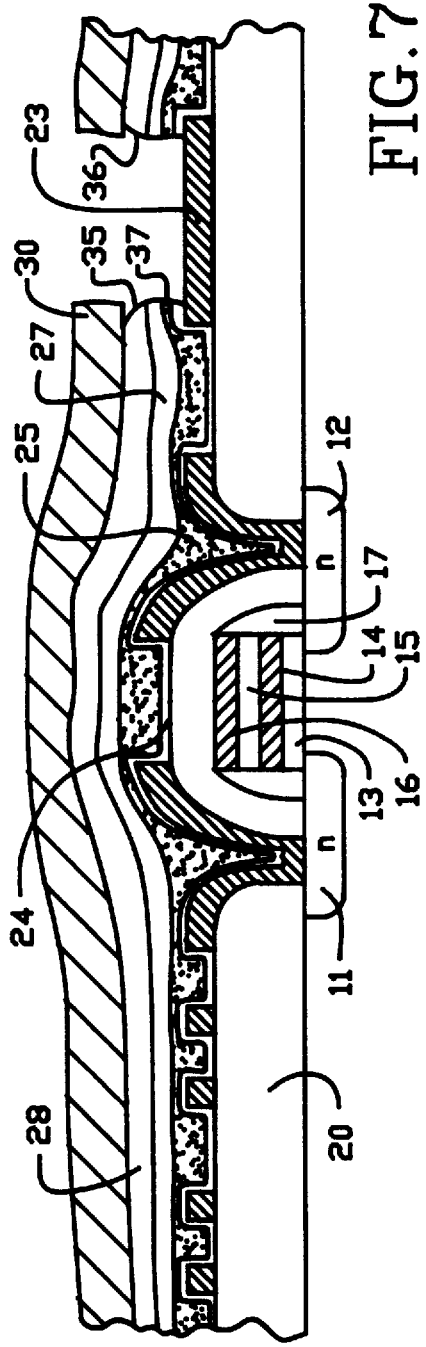
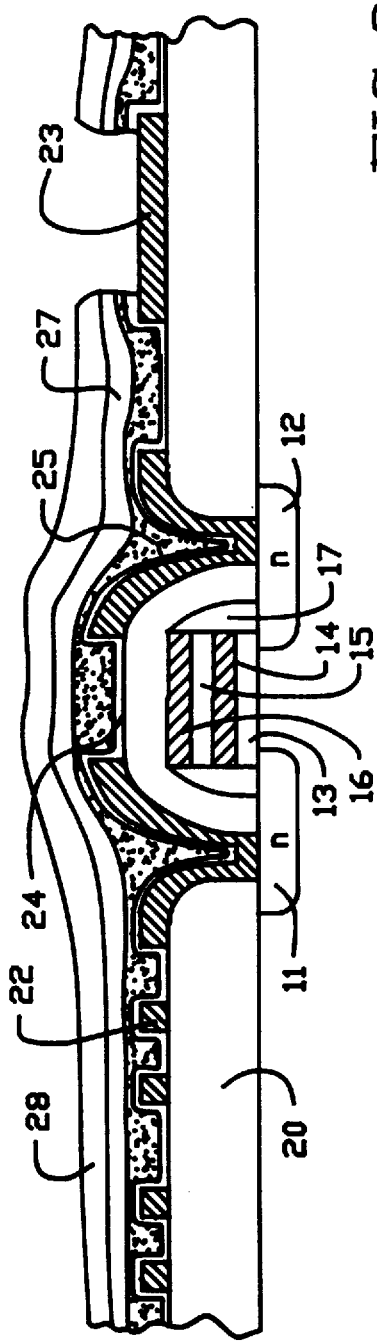
FIG. 7
FIG. 8

INTEGRATED CIRCUIT PASSIVATION PROCESS AND STRUCTURE

BACKGROUND OF THE INVENTION

1. Field of the Invention

The present invention relates to integrated circuit passivation structures and processes, and more particularly to a passivation process and structure adapted for UV erase EPROMs.

2. Description of Related Art

An integrated circuit passivation layer coats the device with a protective covering. The protective covering performs a number of functions, including protecting the device from stress which may occur during package molding or otherwise, and protecting the device from contamination and moisture in the environment. Thus, passivation structures should be resistant to thermal and mechanical stress, non-porous to mobile ions which may appear on the surface of the device particularly in moist conditions, and electrical insulating. For some devices, which include UV erase EPROM cells, the passivation layer must also be transmissive to the ultraviolet radiation.

The passivation layer, in addition to providing a protective coating for the device, must be opened over contact pads formed on the device. The contact pads are used for connecting wiring in the package to the metal layers on the integrated circuit. Thus, the passivation process must support a technique for making openings in the passivation layer to expose contact pads.

All of these features have led to significant development in the field of passivation layers for integrated circuits. The following U.S. Patents provide background information for the present invention: U.S. Pat. No. 4,581,622 entitled UV ERASABLE EPROM WITH UV TRANSPARENT SILICON OXYNITRIDE COATING; U.S. Pat. No. 5, 260,236 entitled UV TRANSPARENT OXYNITRIDE DEPOSITION IN SINGLE WAFER PECVD SYSTEM; U.S. Pat. No. 5,010,024 entitled PASSIVATION FOR INTEGRATED CIRCUIT STRUCTURES; U.S. Pat. No. 4,618,541 entitled METHOD OF FORMING SILICON NITRIDE FILM TRANSPARENT TO ULTRAVIOLET RADIATION AND RESULTING ARTICLE; U.S. Pat. No. 5,306,946 entitled SEMI-CONDUCTOR DEVICE HAVING A PASSIVATION LAYER WITH SILICON NITRIDE LAYERS; U.S. Pat. No. 4,665,426 entitled EPROM WITH ULTRAVIOLET RADIATION TRANSPARENT SILICON NITRIDE PASSIVATION LAYER; and U.S. Pat. No. 4,986,878 entitled PROCESS FOR IMPROVED PLANARIZATION OF THE PASSIVE LAYERS FOR SEMI-CONDUCTOR DEVICES.

Notwithstanding substantial development in the art of passivation layers, it is desirable to provide an improved structure. Particularly, it is desirable to provide a passivation structure and process which can completely fill the voids in underlying structures as the design rules for integrated circuits shrink, which provides protection against moisture and mobile ion penetration, which involves a process which does not degrade device reliability, which has high UV light transparency for efficient UV erase of EPROM cells, and which is cost-effective and manufacture worthy.

SUMMARY OF THE INVENTION

The present invention achieves the goals stated above for providing a improved passivation process and coating. It can be characterized as a method for forming a passivation coating on an integrated circuit, after completion of the active device and metal routing circuitry. These precursor processes result in an integrated circuit having a non-planar features, and at least one conductive pad for providing connection to the packaging. The method comprises the following steps:

depositing a first dielectric layer over the integrated circuit;

smoothing out underlying features by applying a layer of flowable dielectric over the first dielectric layer;

depositing a second dielectric layer over the flowable dielectric;

establishing a protective pattern layer, such as photoresist, over the second dielectric coating, and defining an opening in the protective pattern layer over the at least one conductive pad;

using a wet etch process to remove portions of the second dielectric layer exposed by the opening;

using a dry etch process to remove portions of the remaining layers exposed through the opening, including the remaining portions of the second dielectric layer, the flowable dielectric layer and the first dielectric layer, down to the conductive pad; and removing the protective pattern layer.

According to one aspect of the invention, the first dielectric layer, composed of silicon oxynitride, is deposited using a plasma enhanced chemical vapor deposition to form a dielectric layer resistant to mobile ion penetration, and having high quality.

The step of smoothing out the underlying features is accomplished by spin coating and curing a flowable glass over the first dielectric layer to smooth out the underlying features. The flowable glass is coated using a process which results in a thickness over the conductive pad of less than 0.1 micron in a preferred process. Further, there is no etch back process used to thin out the cured flowable glass.

According to another aspect of the present invention, the second dielectric layer is composed of a first protective dielectric such as silicon oxynitride deposited using plasma enhanced chemical vapor deposition, to protect the flowable dielectric layer from the subsequent wet etch process. The second dielectric layer also includes a top layer deposited using plasma enhanced chemical vapor deposition and comprising phosphorus doped silica glass to provide a stress buffer and ion capture layer to prevent penetration of mobile ions to the first dielectric layer. The phosphorus doped silica layer is deposited using both high frequency and low frequency power for plasma formation during the deposition to increase the quality of the layer.

The top layer thus has a characteristic wet etch rate faster than the wet etch rate of the bottom layer. The wet etch process is timed so that it stops when it reaches the protective dielectric layer. This prevents the wet etch materials from penetrating to the flowable dielectric layer in the wet etch process. The dry etch is used to complete the opening of the contact pad.

According to yet another aspect of the invention, the dry etch process includes a first plasma etch to expose the at least one conductive pad, and a second plasma etch to minimize dielectric residues on the at least one conductive pad. The wet etch process according to this aspect of the invention is used to minimize the amount of time that plasma etching needs to be applied to the device during the passivation process. A smaller amount of plasma etch time reduces the possibility that the integrated circuit will suffer defects during the contact pad opening process.

The present invention can also be characterized as a passivation layer made according to the methods described above. Thus, the structure will provide a passivation layer which comprises a dielectric barrier layer resistant to penetration by moisture and mobile ions. A planarization layer is placed on the dielectric barrier layer, smoothing out underlying features. A stress buffer and ion capturing layer is deposited over the planarization layer. The stress buffer and ion capturing layer may also include an underlying protective layer which prevents wet etch processes used for exposing the contact pads from reaching the planarization layer.

According to yet another aspect of the present invention, the passivation structure outlined above is used on an integrated circuit which includes UV erasable EPROM cells. According to this aspect, the passivation structure is transparent to the UV radiation used for erasing the EPROM cells.

Accordingly, the present invention provides a planarization process particularly suited to use with UV erase EPROMs. The planarization process of the present invention achieves substantially voidless gaps between the metal spaces, provides protection against moisture and mobile ion penetration, does not degrade device reliability, has high UV light transparency, and provides a cost-effective, manufacture worthy process.

Other aspects in and advantages of the present invention can be seen upon review of the Figures, the detailed description, and the claims which follow.

BRIEF DESCRIPTION OF THE FIGURES

FIG. 1 is a cross sectional view of an integrated circuit including an EPROM cell with a high quality barrier dielectric formed thereon.

FIG. 2 is a cross sectional diagram of the integrated circuit of FIG. 1, having a spin-on-glass layer over the barrier dielectric.

FIG. 3 is a cross sectional diagram of the integrated circuit of FIG. 1, having a protective, etch stop dielectric coating over the spin-on-glass.

FIG. 7 is cross sectional diagram of the integrated circuit of FIG. 1, after a plasma etch process.

FIG. 8 is a cross sectional diagram of the integrated circuit of FIG. 1, having the completed passivation structure formed thereon.

DETAILED DESCRIPTION OF THE FIGURES

Figure 4:
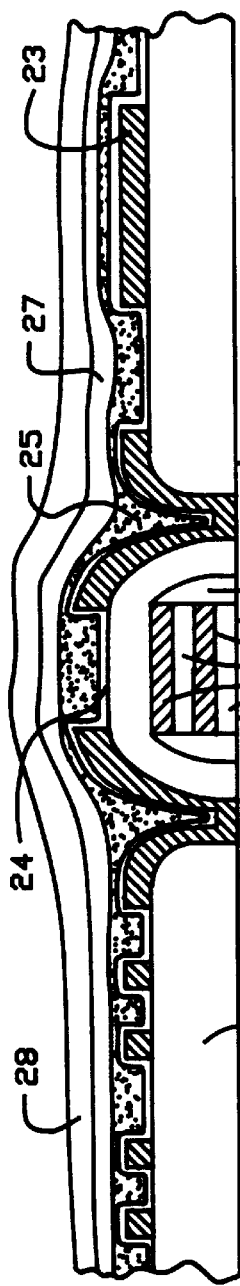
FIG. 4 is a cross sectional diagram of the integrated circuit of FIG. 1, having a phosphorus doped glass over the protective etch stop dielectric.

A detailed description of the present invention is described with reference to FIGS. 1–12, which provide a step by step illustration of the process, and the structure used for passivation according to the present invention.

In FIG. 1, a cross sectional diagram of the EPROM structure is shown, where the line 10 represents the surface of an integrated circuit substrate. A UV erase EPROM cell is formed therein having n-type buried diffusion regions 11 and 12 providing the source and drain for the memory cell. A thin insulator 13 is formed over the channel region of the EPROM device. A floating gate 14 is formed over the thin insulator 13. An insulator 15 is formed over the floating gate, and a control gate, or word line, polysilicon layer 16 is formed over the insulator 15. A side wall dielectric spacer 17 is formed on the side of the stack composed of the dielectric 13, the floating gate 14, the dielectric 15 and the control gate line 16. An insulating layer 18 is formed over the stack to isolate the polysilicon 16 from the metal layers following. This insulating layer also extends in the regions 19 and 20 to cover the semiconductor substrate. A metal contact 21 is formed in an opening established through the insulating material 18 down to the buried diffusion region 11. Also, metal lines 22 are patterned on the surface of the device for a variety of reasons. The device may have metal line spacings "X" on the order of six tenths of a micron. Also disposed on the integrated circuit over the dielectric 19 is a metal contact pad 23.

According to the present invention, a high quality dielectric barrier 24 is formed over the underlying metal structures (21, 22, 23). The barrier dielectric 24 is formed of silicon oxynitride SiON in this example, or silicon nitride, using a plasma enhanced CVD process targeted to have the following properties:

thickness: 3000 to 4000 Angstroms,

UV transmittance at 254 nm wavelength: >70% at 4000 Angstroms, stress: 1.0 E9–1.5 E10 dynes/cm$^2$ compressive total H content: 1.0–2.0 E22 per cubic centimeter SiH content: 0.5–2.5 E21 per cubic centimeter refractive index: 1.75–1.92

The result of this process is a high quality barrier which blocks out moisture and mobile ions from reaching the underlying metal or other semiconductor structures.

After the growth of the high quality barrier dielectric 24, the opening over the metal contact 21 may be as narrow as 0.1 microns wide and 1.2 microns or more deep.

FIG. 2 illustrates the next step in the process of defining a passivation layer according to the present invention. According to the next step, a flowable dielectric layer 25 is deposited. This dielectric layer is laid down using a spin coat of flowable glass to fill the gaps between the metal lines and to smooth out the wafer surface. The flowable glass is then cured at about 420° C. to solidify the glass. The targeted properties of the spin-on-glass SOG after curing are as follows:

thickness (Angstroms): 2000 to 5500 refractive index: 1.3–1.4 gap fill: complete fill of 0.1 µm wide and >1.2 µm deep gaps.

planarity: >90% at large metal spacings (>40 µm metal spacing)

SOG thickness on top of large metal pad (Angstroms): <1000 stress: 2 E8–7 E8 dynes/cm$^2$ tensile

Thus, the flowable dielectric fills the gaps between the metal lines and the dimples within the contact holes and generally planarizes the underlying topography.

The spin-on-glass layer is not etch backed. Further it is applied using a process which minimizes the thickness of the spin on dielectric in the region generally 26 over the metal contact pad 23.

The spin-on-glass coating process consists of a dispense step, a spread step, and a dry setting step. In the dispense step, a controlled amount of flow glass is dispensed under optimized dispense arm movement and wafer rotation speeds. A moveable cap, making an enclosed compartment around the wafer, is then used to control the ambient above the wafer during the spin-spreading step. During the spreading step, the pressure, temperature, and ambient gas composition can be controlled within the enclosed compartment. Typically, a saturated vapor ambient is kept inside the enclosed compartment to keep the glass under a highly flowable state during spreading. The centrifugal force due to the wafer rotation assists in the global smoothing of the flow glass. A high speed rotation is needed at the end of the spreading step to spin off the excess flow glass and reduce the flow glass thickness on top of large metal pads. At the last dry setting step, the ambient is exhausted to dry and set the flow glass.

The base line recipe for the SOG coating process is as follows:

1. Dispense SOG:
    Time (sec): 0–2
    Spin Speed (rpm): 0–200
    Acceleration (rpm/s): 500–2000
    Exhaust (lpm): 0–200
    Cup: open
2. Close Cap:
    Time (sec): 0–5
    Spin Speed (rpm): 0
    Acceleration (rpm/s): 2000–3000
    Exhaust (lpm): 0–200
    Cup: closing
3. Spread/Flow-in:
    Time (sec): 0–30
    Spin Speed (rpm): 0–500
    Acceleration (rpm/s): 1000–3000
    Exhaust (lpm): 0–200
    Cup: closed
4. Open Cap:
    Time (sec): 0–5
    Spin Speed (rpm): 0
    Acceleration (rpm/s): 2000–3000
    Exhaust (lpm): 0–400
    Cup: opening
5. Spinoff:
    Time (sec): 0–20
    Spin Speed (rpm): 3000–5000
    Acceleration (rpm/s): 5000–10000
    Exhaust (lpm): 0–400
    Cup: open Thus, the first step involves dispensing the SOG material such as commercially available siloxane polymer based materials, like Allied Signal 512, 214 or 314, or others sold by Hitachi. This step takes less than about 2 seconds with a final spin speed of less than about 200 revolutions per minute. The final spin speed is set rapidly with an acceleration rate of about 500–2000 rpm. Exhaust in the SOG chamber is set at less than about 200 liters per minute (lpm) with the cap open.

After the dispense step, the cap is closed. This process takes up to 5 seconds. The spin speed is set with a rapid deceleration from 2000–3000 rpm per second to 0 rpm. The exhaust during the cap closing step remains set at up to about 200 lpm.

After the cap is closed, the SOG material is spread and flowed in. This process takes up to about 30 seconds, preferably greater than about 20 seconds, with a relatively low spin speed of up to about 500 rpm, preferably less than about 250 rpm. The spin speed is set with a acceleration rate of about 1000–3000 rpm per second with the exhaust in the outside chamber remaining at a value up to about 200 lpm. During this process, the cap is closed, isolating the space inside the closed cap from the external exhaust, so that the evaporation rate of the SOG solvent is slowed down.

In the next step, the cap is opened. This step takes about up to 5 seconds with a 0 rpm spin speed. The spin speed is set with a deceleration in a range of 2000–3000 rpm per second. The exhaust is increased to a value of up about 400 lpm while the cap is being opened.

The final step is the spin off step which takes up to about 20 seconds. During spin off, the wafer rotates at a value between 3000–5000 rpm. The final spin speed is reached with rapid acceleration in the range of 5000–10000 rpm/s. The exhaust in the chamber is up to about 400 lpm with the cap open.

The equipment utilized consists of a standard SOG coating chamber modified to include a closeable cap structure which is rotated synchronously with the wafer support, such as a mechanism described in published German patent application 4203913, filed 11 Feb. 1992, invented by Gabriel, et al., except modified for use with silicon wafers.

This process allows much longer spread/flow-in time and a much lower spread/flow-in rotation speed compared to prior art systems to achieve system planarity, and accomplishes a thin SOG layer over the metal contact pads without an etch back step.

FIG. 3 illustrates the next step in the process. According to the next step, a plasma enhanced CVD dielectric layer 27 is deposited over the spin-on-glass 25. The resulting film is targeted to have the following properties:

wet etch rate in 10:1 BOE (Angstroms/min): <=800 thickness: 2000 to 3000 Angstroms,

UV transmittance at 254nm wavelength: >70% at 4000 Angstroms stress: 2.0 E9 to 1.5 E10 dynes/cm$^2$ total H content: 1.0–2.0 E 22/cm$^3$ SiH content: 0.5–2.5 E 21/cm$^3$ refractive index: 1.75–1.92

The 10:1 BOE listed above refers to wet, isotropic etch chemistry consisting of a 10 to 1 ratio of $NH_4F$ to HF solutions. The HF solution has a concentration 5% HF in distilled water solution and the $NH_4F$ has a concentration of 36% $NH_4F$ in distilled water.

Thus layer 27 provides a protective covering, silicon oxynitride in this example, or silicon nitride, for the spin-on-glass 25. It acts as a wet etch stop layer because its composition has a relatively low wet etch rate. Thus, the wet etch steps used to make openings over the contact 23 do not reach the spin-on-glass layer 25.

FIG. 4 illustrates a next step in the process of the present invention. In particular, a phosphorus doped silica glass (PSG) layer 28 is deposited over the protective layer 27. The phosphorus doped silica glass 28 is deposited using a dual frequency plasma enhanced chemical vapor deposition. The film properties are targeted as follows:

thickness (Angstroms): 10000 to 16000

UV transmittance: >65% at 10000 Angstroms thickness, stress (dynes/cm$^2$): 2 E8 to 1 E9 compressive total phosphorus content (weight %): 2–4 refractive index: 1.45–1.55 wet etch rate in 10:1 BOE (Angstroms/min): 1500–3000

The phosphorus containing glass top layer 28 provides a stress buffer and captures mobile ions, so that the mobile ions do not reach the underlying layers of the device.

The phosphorus glass layer process uses both high frequency (13.56 MHz) and low frequency (350 KHz) power for high quality film deposition.

The high and low frequency plasma are used at the same time in the deposition step. The high frequency plasma produces less charge bombardment to the wafer surface during film growth. The low frequency plasma introduces more energetic reactant on wafer surface for higher surface mobility. The high mobility of reactants on wafer surface improves the film density and its conformity to underlying topography. The desired PSG film properties, such as density, stress, wet etching rate, et cetera, can be engineered by adjusting the balance between the high and low RF frequency powers.

Figure 5:
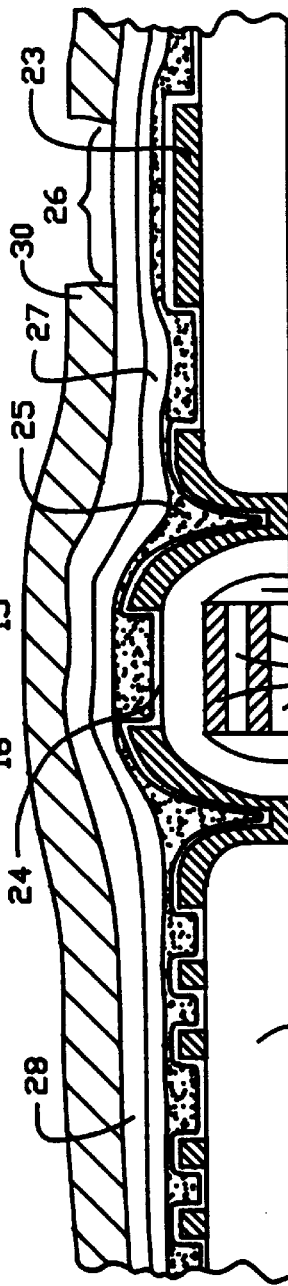
FIG. 5 is a cross sectional diagram of the integrated circuit of FIG. 1, having a patterned photoresist layer over the phosphorus doped glass.

After depositing the passivation structure, openings must be made to metal contact pads 23 on the integrated circuit. Thus, FIG. 5 illustrates the first step in establishing the openings to the contact pads 23. In particular, a photoresist layer 30 or other protective patterning layer is deposited over the top layer 28 of the passivation structure. One creates the photoresist layer 30 by applying the photoresist, exposing the pattern desired, and developing resist to define the bond pad openings. As can be seen, there is an opening in the region, generally 26, over the metal contact pad 23.

Figure 6:
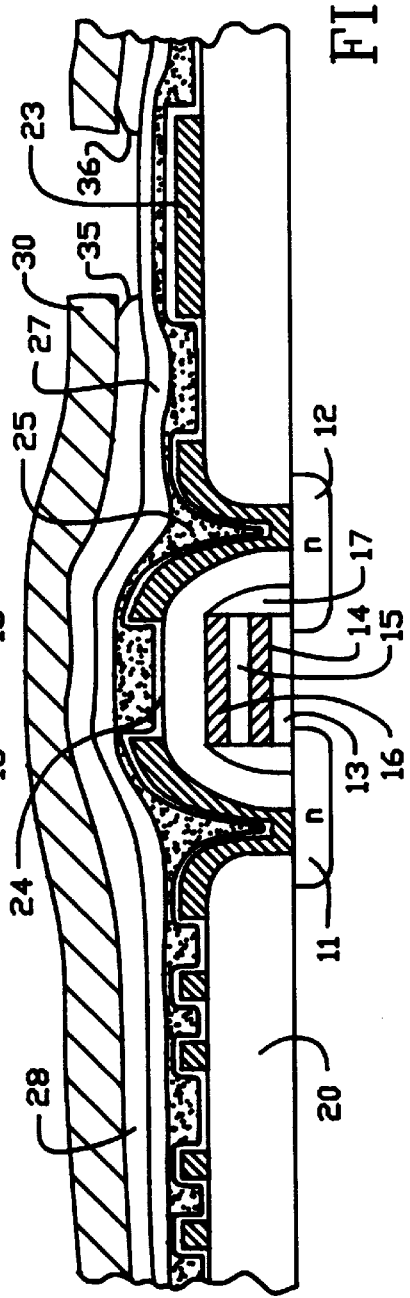
FIG. 6 is a cross sectional diagram of the integrated circuit of FIG. 1, after a wet etch process.
Figure 9:
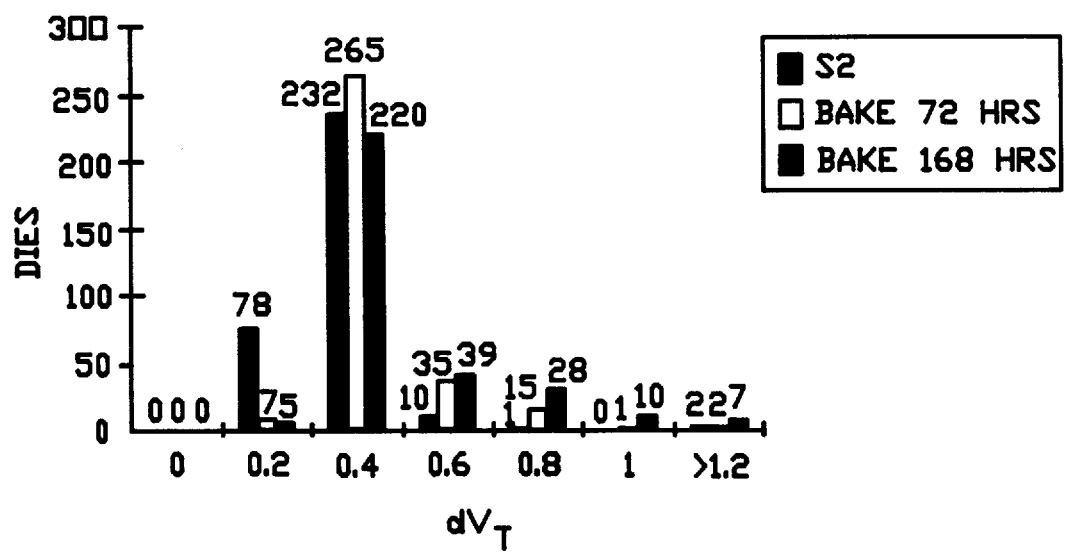
FIG. 9 is a graph showing changes in threshold voltages $dV_T$ of programmed EPROM cell after the wafer level retention bake.
Figure 10:
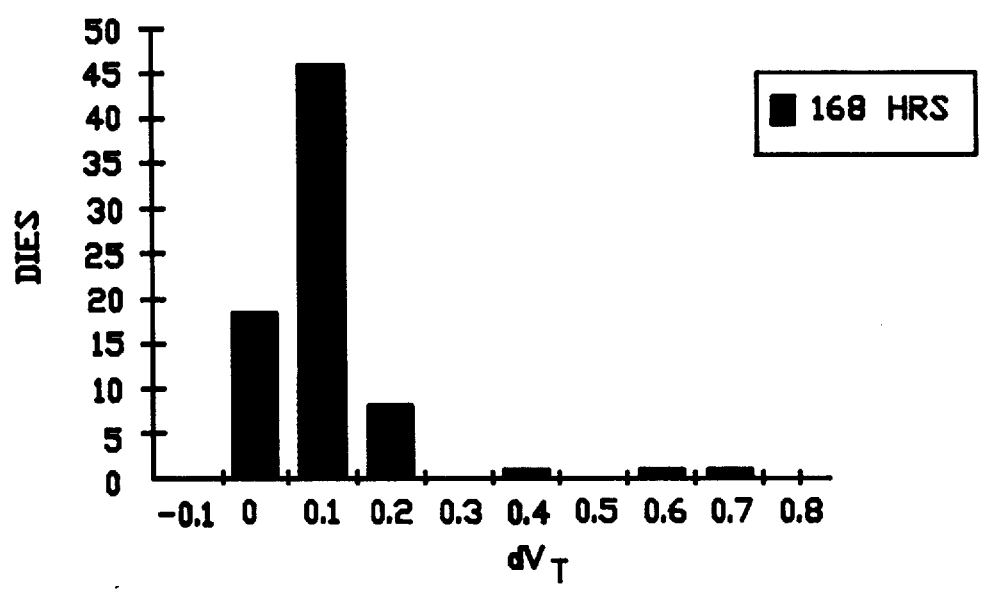
FIG. 10 is a graph like that of FIG. 10, except after die level retention bake.

Next, as shown in FIG. 6, the circuit is exposed to an isotropic wet etch process using a 10:1 BOE to etch the topmost phosphorus doped silica glass layer 28 and part of the wet etch stop layer 27. The wet etch stop layer 27 has a low enough wet etch rate so that it behaves as an etch stop during this process. This prevents wet etching of the underlying flowed glass layer 25. Thus, a structure having tapered walls, e.g. 35, 36, and slightly undercutting the photoresist 30 is formed over the contact pads 23.

The isotropic etch process is timed with enough control that the wet etch process does not cut through the wet etch stop layer 27 or otherwise reach the spin-on-glass layer.

As illustrated in FIG. 7, the next step involves an etch of the remaining passivation layers, which is anisotropic, including the remaining portions of the wet etch stop layer 27, the flowed glass 25, and the high quality barrier dielectric 24. The anisotropic etch process results in the vertical walls, e.g. wall 37, in the opening over the contact pad 23. The etch chemistry consists of $CHF_3$, $SF_6$ and He. The dry etch is done in a plasma environment first with a main etch step. After the majority of the bonding pads on the wafer are opened by the main etch, an overetch process is added to ensure that all pads are open and that no oxide residue remains on the pads. Both the main etch and the overetch steps may induce charging damage to the device due to the high power plasma used. It is found that a device may fail if the dry etch time is over a maximum allowable dry etch time. Thus, the present invention provides use of a wet etch step as described above with reference to FIG. 6, to substantially reduce the amount of time needed for the dry etch step. Thus, the wet etch stop layer may be used to avoid a wet etch attack of a flowed glass layer 25.

The final step in the process is the stripping of the photoresist mask 30, which according to the recipe described above is done using an $O_2$ plasma gas process.

The following process parameters and settings are typical for the passivation process described above:

| Parameter | Layers 24, 27 (SiON) | Layer 28 (PSG) |
|---|---|---|
| pressure (torr) | 1–6 | 1–4 |
| 13.56 MHz (Watt) | 200–650 | 30–800 |
| 350 Hz RF (Watt) |  | 30–500 |
| temperature (C.) | 350–430 | 350–430 |
| susceptor spacing (mil) | 200–650 | 200–500 |
| $SiH_4$ flow rate (sccm) | 50–120 | 20–180 |
| $N_2O$ flow rate (sccm) | 0–300 | 500–2000 |
| $NH_3$ flow rate (sccm) | 60–120 |  |
| $N_2$ flow rate (sccm) | 1000–5000 |  |
| $PH_3$ (sccm) |  | 20–180 |

The resulting structure is shown in FIG. 8. Thus, an integrated circuit which includes an EPROM cell having the floating gate 14, the source 11 and the drain 12 as shown includes a passivation structure according to the present invention. A first high quality dielectric layer composed of silicon oxynitride is formed over the metal structures 21, 22. A flowed dielectric 25 is deposited over the high quality dielectric 24 to smooth out the underlying features. A wet etch stop layer 27 composed of silicon oxynitride, which protects the underlying flowed glass 25 from subsequent wet etch processes is then applied. Finally, the phosphorus doped glass (PSG) 28 overlies the wet etch stop layer 27. The openings over the metal contact 23 are reliably formed. The gaps in the underlying metal structures are filled without voids. Excellent protection against moisture and mobile ion penetration is provided. Device reliability does not degrade due to the passivation processes, such as charge retention loss or gain failures, temperature cycling failures, pressure cooking failures, et cetera. Furthermore, all of the layers deposited according to the present invention have a high UV light transparency for efficient UV erase of programmed EPROM cells.

Furthermore, a cost effective, manufacture worthy process has been created for use in very small geometry integrated circuit design.

Accordingly, the present invention provides a passivation process by which after completion of the active device in metal routing circuitry, the following steps are performed:

1) deposit a high quality plasma enhanced CVD dielectric barrier;

2) coat with a spin-on-glass layer;

3) deposit a plasma enhanced CVD dielectric with a low etching rate;

4) deposit a plasma enhanced CVD phosphorus containing glass top layer;

5) apply photoresist and expose the photoresist to define the bond pad pattern;

6) perform the wet etch portion of the pad etch process;

7) perform the dry etch portion of the pad etch process; and 8) remove the photoresist.

An EPROM cell consists of a floating gate 14 of FIG. 8, and a control gate 16 of FIG. 8. The electrical passage between the source and drain active regions 11, 12 of FIG. 8 is determined by the status of the floating and control gates. When charge is intentionally added onto a floating gate, the charge will increase the threshold voltage $V_T$ required on the control gate to open the electrical passage between the source and drain. For one binary state, the amount of charge added on the floating gate 50 is adjusted that the $V_T$ is about 12 volts. As long as the charge remains on the floating gate, the $V_T$ will remain at around 12 volts. The uncharged cells, representing the other binary state, will have a lower threshold voltage $V_T$ of about 4 volts. During a "read" cycle, the control gate voltage will be set at 8 volts, so that the charged cells will not conduct current (passage shut) and the uncharged cells will (passage open). The proper function of the EPROMs depends on the capability of floating gates to keep the correct amount of charge on them.

During the operation of EPROMs, moisture and mobile ions can penetrate a poor quality passivation and induce charge loss (or gain) on the floating gate 14 of FIG. 8. The charge loss/gain will result in a change of control gate $V_T$ and the degradation of the EPROM cells. The barrier quality of a passivation is usually tested before shipment through a procedure called retention bake, where the EPROMs under test will go through an extended baking, usually at 250° C. temperature, and the change in threshold voltage $dV_T$ is monitored at specific time intervals. The change in $V_T$ is a direct indication of device degradation. This retention bake can be done either at the wafer level or after the packaging at the die level. Typically the sample size will be a few hundred dies, each with millions of memory cells. The wafer level and die level retention bake test results are summarized in FIG. 9 and FIG. 10 for the passivation structure of the present invention. The $dV_T$ data shown here is well within commercially acceptable specifications (<1.5V).

One main function of passivation on integrated circuit (IC) is to protect the IC from damage due to severe temperature, humidity, and abrasive mechanical stress through packaging and IC usage life. The reliability of an IC is usually tested through various accelerated tests, known as quality assurance. Extensive reliability tests on the proposed passivation structure have been conducted. The tests include temperature cycle, pressure cook test (PCT), thermal shock, electrical static discharge, low temperature storage, and temperature humidity tests. The proposed passivation structures have passed all these reliability tests. It is found that the proposed passivation affects the PCT test the most. During PCT test, the devices are subjected to 121° C., 100% humidity, and 2 atmosphere pressure ambient for 168 hours. The functionality of the samples is measured before and after the pressure cook for % yield comparison. It is found that with the proposed passivation, the yield lost is about 2%. The prior art passivation failed catastrophically (>90% lost) in this test. This is a significant advantage of the proposed passivation structure.

The UV light transparency of the passivation structure should be high enough for easy erasure of programmed cells. The EPROM cell erasability test consists of the following steps:

1) shine 254 nm UV light to make sure that all EPROM cells have no residue charge on the floating gates before start testing. (The UV light provides enough excitation to the charge on the floating gate that charge can escape from the floating gate).

Figure 11:
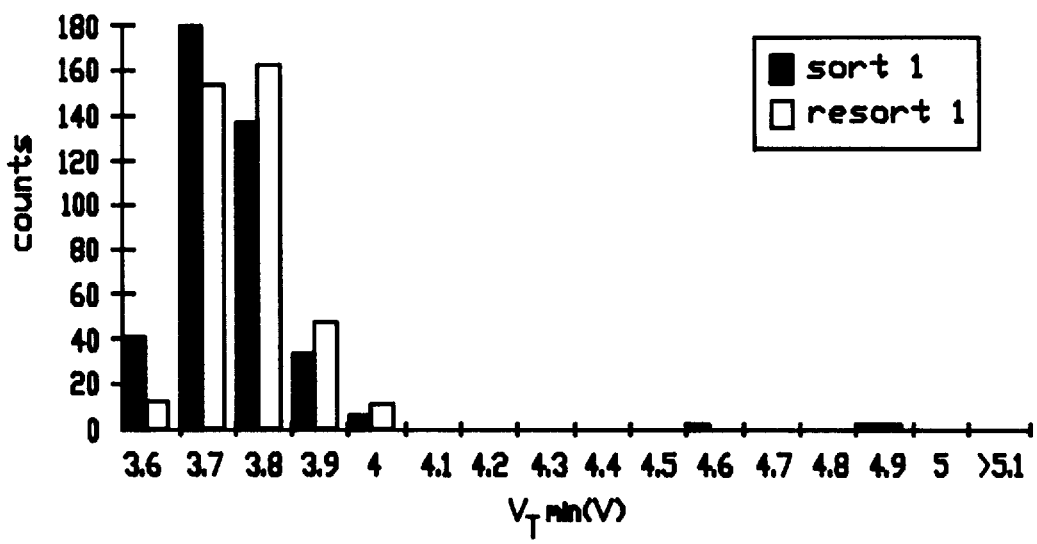
FIG. 11 is a graph showing UV erase capability of the inventive passivation structure, where $V_T(min)$ for uncharged cells has a tight distribution around 3.8 volts.

2) measure the minimal threshold voltage $V_T(min)$ that is required to turn on all non-programmed cells in each die, and tabulate the number of dies that fall into each bin of $V_T(min)$ (see FIG. 11).

3) program all the cells by adding charge on the floating gates.

4) shine 254 nm UV light onto device through passivation.

5) remeasure the $V_T(min)$ for each die and compare the $V_T(min)$ bin distribution with that obtained in step 2. If the charges on the floating gates were not completely erased at step 4 due to poor UV transmittance of the passivation layers, a tailing towards higher $V_T(min)$ distribution will occur.

Figure 12:
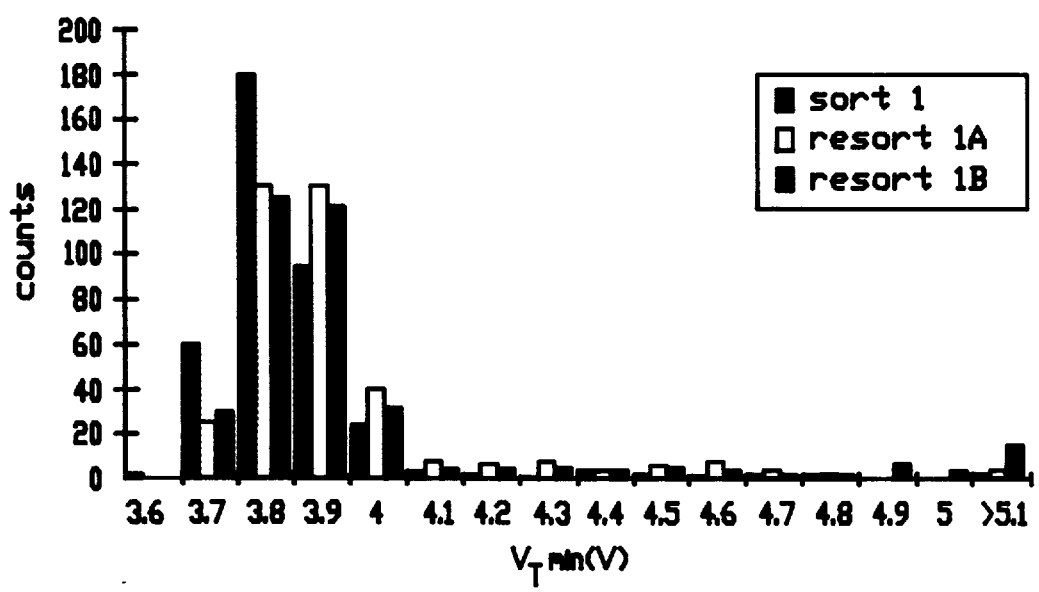
FIG. 12 is a graph showing poor UV erasable passivation structure that has wide spread $V_T(min)$.

FIGS. 11 and 12 compare the $V_T(min)$ bin distributions of the passivation based on the present invention, and a poor UV erasable passivation. FIG. 11 is clean at >4.0 volts, but the prior art process had a wide tail at the large $V_T(min)$ end (FIG. 12).

The additional cost of the proposed passivation is mainly due to the addition of flowed glass coating. Since no etch back step is used, the additional cost per wafer is relatively low and is well justified by the excellent reliability provided. The manufacturability is optimized by limiting the pad dry etch time with the addition of a wet etch step and by adding a wet etch stop layer on top of the flow glass.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for forming a passivation coating over metal routing circuitry on an integrated circuit having non-planar features, the passivation coating having an opening over at least one conductive pad formed on the integrated circuit and adapted for connecting wiring external to the integrated circuit to said metal routing circuitry, comprising:

depositing a first dielectric layer over the metal routing circuitry and the at least one conductive pad on the integrated circuit;

smoothing out the non-planar features by applying a flowable dielectric layer over the first dielectric layer;

depositing a second dielectric layer over the flowable dielectric layer;

establishing a protective pattern layer over the second dielectric coating, and defining an opening in the protective pattern layer over the at least one conductive pad;

using a process which is isotropic to remove portions of the second dielectric layer exposed by the opening;

using a process which is anisotropic to remove portions of remaining layers exposed through the opening, including the remaining portions of the second dielectric layer, the flowable dielectric layer and the first dielectric layer, down to the at least one conductive pad; and removing the protective pattern layer.

2. The method of claim 1, wherein the step of depositing a first dielectric layer includes using plasma enhanced chemical vapor deposition to form a dielectric layer resistant to mobile ion penetration.

3. The method of claim 1, wherein the step of applying a flowable dielectric layer includes spin coating and curing a flowable glass over the first dielectric layer to smooth out underlying features.

4. The method of claim 3, wherein the step of applying a flowable dielectric layer does not include an etch back to thin out the cured flowable glass.

5. The method of claim 3, wherein the cured flowable glass has a thickness over the conductive pad of less than 0.1 micron.

6. The method of claim 1, wherein the step of depositing a second dielectric layer includes using a plasma enhanced chemical vapor deposition to form a protective dielectric layer to protect the flowable dielectric layer from the subsequent wet etch process.

7. The method of claim 6, wherein the plasma enhanced chemical vapor deposition used for the protective dielectric layer includes applying silicon oxynitride.

8. The method of claim 1, wherein the step of depositing a second dielectric layer includes using a plasma enhanced chemical vapor deposition to form a phosphorous doped silica layer providing a stress buffer and preventing penetration of mobile ions to the first dielectric layer.

9. The method of claim 8, wherein the plasma enhanced chemical vapor deposition used for the phosphorous doped silica layer includes applying both high frequency and low frequency power for plasma formation during the deposition.

10. The method of claim 1, wherein the second dielectric layer includes a top layer having a characteristic etch rate for isotropic etch, and a bottom layer having a characteristic etch rate slower than the top layer for the isotropic etch, and the isotropic etch process is timed to prevent etch materials from penetrating the bottom layer to protect the flowable dielectric layer from the isotropic etch step.

11. The method of claim 1, wherein the first dielectric layer, the flowable dielectric layer and the second dielectric layer comprise materials transmissive to ultraviolet radiation.

12. The method of claim 1, wherein the anisotropic etch step includes plasma etching.

13. The method of claim 1, wherein the anisotropic etch step includes a first plasma etch to expose the at least one conductive pad, and a second plasma etch to minimize dielectric residues on the at least one conductive pad.

14. A method for forming a passivation coating over metal routing circuitry on an integrated circuit having non-planar features, the passivation coating having an opening over at least one conductive pad formed on the integrated circuit and adapted for connecting wiring external to the integrated circuit to said metal routing circuitry, comprising:

depositing a first dielectric layer over the metal routing circuitry and the at least one conductive pad on the integrated circuit using plasma enhanced chemical vapor deposition;

spin coating and curing a flowable glass over the first dielectric layer;

depositing a second dielectric layer comprising silicon oxynitride over the cured flowable class using plasma enhanced chemical vapor deposition;

depositing a third dielectric layer comprising phosphorous doped silica over the second dielectric layer using plasma enhanced chemical vapor deposition to provide a barrier to mobile ions;

establishing a protective pattern layer over the third dielectric coating, and defining an opening in the protective pattern layer over the at least one conductive pad;

using an etch process which is isotropic to remove portions of the third dielectric layer exposed by the opening down to the second dielectric layer;

using an etch process which is anisotropic to remove portions of remaining layers exposed through the opening, including the second dielectric layer, the cured flowable glass layer and the first dielectric layer, down to the at least one conductive pad; and removing the protective pattern layer.

15. The method of claim 14, wherein the plasma enhanced chemical vapor deposition used for the third dielectric layer includes applying both high frequency and low frequency power for plasma formation during the deposition.

16. The method of claim 14, wherein the third dielectric layer has a characteristic isotropic etch rate faster than the second dielectric layer, and the isotropic etch process is timed to prevent etch materials from penetrating the second dielectric layer to protect the cured flowable glass layer from the isotropic etch step.

17. The method of claim 14, wherein the integrated circuit includes UV erasable EPROM cells, and the first dielectric layer, the cured flowable glass layer, the second dielectric layer and the third dielectric layer comprise materials transmissive to ultraviolet radiation used to erase the EPROM cells.

18. The method of claim 14, wherein the anisotropic etch process includes plasma etching.

19. The method of claim 14, wherein the anisotropic etch process includes a first plasma etch to expose the at least one conductive pad, and a second plasma etch to minimize dielectric residues on the at least one conductive pad.

20. The method of claim 14, wherein the step of spin coating and curing a flowable glass does not include an etch back to thin out the cured flowable glass.

21. The method of claim 20, wherein the cured flowable glass has a thickness over the conductive pad of less than 0.1 micron.

* * * * *